(12) United States Patent
Kitamura

(10) Patent No.: US 6,473,886 B2
(45) Date of Patent: Oct. 29, 2002

(54) CONSTANT IMPEDANCE DRIVER CIRCUIT INCLUDING IMPEDANCE MATCHING WITH LOAD AND A METHOD FOR DESIGNING THE SAME

(75) Inventor: Akira Kitamura, Takatsuki (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/821,692

(22) Filed: Mar. 30, 2001

(65) Prior Publication Data

US 2001/0038302 A1 Nov. 8, 2001

(30) Foreign Application Priority Data

Apr. 3, 2000 (JP) ........................................ 2000-100146

(51) Int. Cl.[7] ............................................... G06F 17/50
(52) U.S. Cl. .................. 716/4; 716/3; 716/5; 716/6; 326/30; 327/276
(58) Field of Search ................................ 716/3, 4, 5, 6; 326/30; 327/276

(56) References Cited

U.S. PATENT DOCUMENTS

| 5,327,031 A | * | 7/1994 | Marbot et al. ............... 327/276 |
| 5,933,041 A | | 8/1999 | Sessions et al. ............. 327/319 |
| 6,060,905 A | * | 5/2000 | Bickford et al. ............... 326/30 |
| 6,316,957 B1 | * | 11/2001 | Ang et al. ..................... 326/30 |

FOREIGN PATENT DOCUMENTS

JP          05267952 A      10/1993

\* cited by examiner

Primary Examiner—Vuthe Siek
Assistant Examiner—Thuan Do
(74) Attorney, Agent, or Firm—Parkhurst & Wendel, L.L.P.

(57) ABSTRACT

A plurality of output circuits for supplying current are connected to an output terminal A of a pre-stage circuit. The output circuit, which connects to a switching timing delay mechanism including a delay circuit, performs switching at a timing when current reaches a saturation region. The current is supplied from the output circuit not including the switching timing delay mechanism. Hence, it is possible to keep the output impedance characteristics of an output terminal B constant and to readily realize impedance matching with load.

6 Claims, 5 Drawing Sheets

CONSTANT IMPEDANCE DRIVER CIRCUIT INCLUDING IMPEDANCE MATCHING WITH LOAD AND A METHOD FOR DESIGNING THE SAME

FIELD OF THE INVENTION

The present invention relates to a constant impedance driver circuit for driving load and particularly concerns a constant impedance driver circuit which requires impedance matching with load upon transmitting a high-speed and high-frequency signal, and a method for designing the same.

BACKGROUND OF THE INVENTION

Referring to the drawings, the following will describe an embodiment of an output circuit using a conventional MOS transistor The same members in the figures are indicated by the same reference numerals and the description thereof is omitted.

Upon driving a high-speed and high-frequency signal, an output impedance of the output circuit requires impedance matching with load to prevent reflection noise on an output terminal when transmitting a signal. FIG. 1 shows that a conventionally used output circuit connects to a transmission line serving as load. FIG. 2 shows output current-voltage characteristics of point B shown in FIG. 1. As shown in FIG. 2, the MOS transistor has a saturation region (2) of current. The saturation region (2) is characterized in that an output impedance of the MOS transistor is not constant. Particularly the low-current output circuit reaches the saturation region soon, resulting in larger irregularity in output impedance value.

As an impedance matching method of the output circuit and the load, a method is adopted for inserting a resistance Rd, which is referred to as a damping resistance, at a position of Rd in FIG. 1, which is a terminal of the output circuit. An optimum value of the damping resistance Rd is obtained by the following equation. As indicated in the following equation, when an output impedance value changes dynamically, the damping resistance Rd also has to change dynamically. Thus, impedance matching is extremely difficult between the output circuit and the load.

<Equation for Computing a Damping Resistance Value>

$$Rd = Zo - Rp \quad Rd : \text{damping resistance}$$
$$Rd = Zo - Rn \quad Zo : \text{characteristic impedance}$$
$$Rp : \text{internal resistance value}$$
$$Rn : \text{internal resistance value}$$

Conventionally, in order to solve such impedance mismatch between the output circuit and the load, a method has been adopted in which a MOS driver circuit forms a constant impedance output circuit.

Referring to a second conventional art (JP A5-267952), the following will discuss a conventional constant impedance output circuit.

FIG. 3 is a diagram showing the constant impedance output circuit realized by the conventional art. According to this invention, output current at an output terminal B is supplied from an input terminal A via a gate-source resistance Rgs as well. In this case, a synthetic output impedance at point B of the output terminal may be different from an output impedance, which is obtained until a MOS transistor forming the constant impedance output circuit reaches a saturation region, i.e., a value in a region which is constant in output impedance characteristic, by adding an input resistance Rgt and the gate-source resistance Rgs.

The first problem is that the second conventional art needs to supply current from a gate of the output circuit, i.e., current of a pre-stage circuit (not shown) to the output terminal B in order to keep the output impedance characteristics constant. Normally, the output circuit of the pre-stage circuit used in an LSI is much smaller in current supplying capacity than the output circuit for supplying current to external load. Therefore, in the configuration where current on the output terminal depends upon current supply from the inside of the LSI, sufficient current cannot be supplied.

The second problem is that since the current supply of the output terminal depends upon the current supply of the output circuit and the current supply from the gate, a transistor needs to be smaller in size when the low-current output circuit is realized. Generally, as the transistor is smaller in size, current-voltage characteristics of the output terminal reach the saturation region (2) sooner, and the current supply from the gate needs to increase accordingly. However, as earlier mentioned, the current supply from the gate depends upon the capability of the output circuit in the LSI. Hence, according to the second conventional configuration, it is difficult to realize constant impedance in the low-current output circuit.

DISCLOSURE OF THE INVENTION

In order to solve the above conventional problem, the object of the present invention is to provide a constant impedance driver circuit, in which a plurality of output circuits are connected to an output terminal of a pre-stage circuit and the switching timing is delayed between the output circuits so as to complement necessary current without changing the current supply capability of the output circuit, thereby achieving constant output impedance characteristics.

In order to achieve the above object, the constant impedance driver circuit of the present invention, which is composed of a plurality of output circuits for supplying current from an output terminal of the pre-stage circuit, is characterized in that at least one of the plurality of output circuits is provided with a switching timing delay mechanism, which includes a delay circuit for delaying the output of current behind the other output circuits, the output circuit including the delay mechanism performs switching by using the switching timing delay mechanism at a timing when current supplied from the other output circuits reaches a saturation region, the output circuits not including the delay mechanism, and constant output impedance characteristics are obtained.

Further, the constant impedance driver circuit of the present invention is characterized in that at least one of a plurality of output circuits is provided with a reference potential shift mechanism for making a shift to a higher potential in order to delay the output of current behind the other output circuits, and the output circuit including the reference potential shift mechanism performs switching by using the reference potential shift mechanism at a timing when current supplied from the other output circuits reaches a saturation region, the output circuits not including the reference potential shift mechanism, and constant output impedance characteristics are obtained.

Moreover, the constant impedance driver circuit of the present invention is characterized in that at least one of a plurality of output circuits is provided with a threshold value potential shift mechanism, which shifts a negative logic threshold value to a lower potential and shifts a positive logic threshold value potential to a higher potential than the other output circuits in order to delay the output of current behind the other output circuits, and the output circuit including the threshold value potential shift mechanism performs switching by using the threshold value potential shift mechanism at a timing when current supplied from the other output circuits reaches a saturation region, the output circuits not including the threshold value potential shift mechanism, and constant output impedance characteristics are obtained.

A method for designing a constant impedance driver circuit of the present invention includes a step of obtaining a piecewise-linear of an output terminal current-voltage curve of the output circuit and obtaining a straight line approximate to the piecewise-linear; a segment point analyzing step of finding a segment point of the output terminal current-voltage curve based on the straight line approximate to the piecewise-linear obtained in the above step; a delay time analyzing step of finding a delay time up to the segment point obtained in the above segment point analyzing step; and a step of making the delay time equal to a difference between a delayed switching time of the output circuit including the switching timing delay mechanism and a switching time of the output circuit not including the switching timing delay mechanism. The delay time has been obtained in the above delay time analyzing step.

Additionally, the method for designing a constant impedance driver circuit of the present invention includes a step of making the delay time equal to a difference between the delayed switching time of the output circuit including the reference potential shift mechanism and the switching time of the output circuit not including the reference potential shift mechanism. The delay time has been obtained in the above delay time analyzing step.

Also, the method for designing a constant impedance driver circuit of the present invention includes a step of making the delay time, which has been obtained in the above delay time analyzing step, equal to a difference between the delayed switching time of the output circuit including the threshold value potential shift mechanism and the switching time of the output circuit not including the threshold value potential shift mechanism.

As described above, according to the present invention, at least one of the plurality of output circuits for supplying current from the output terminal of the pre-stage circuit is provided with the switching timing delay mechanism, the reference potential shift mechanism, and the threshold value potential shift mechanism. Thus, it is possible to complement necessary current without increasing the current supply, as compared with the case in which a single transistor supplies current for an output impedance, thereby obtaining constant output impedance characteristics of the output terminal. Such a configuration makes it possible to readily realize impedance matching with load as compared with the conventional art. Consequently, it is possible to keep the output impedance characteristics constant even in the low-current output circuit.

DESCRIPTION OF THE EMBODIMENTS

Figure 1:
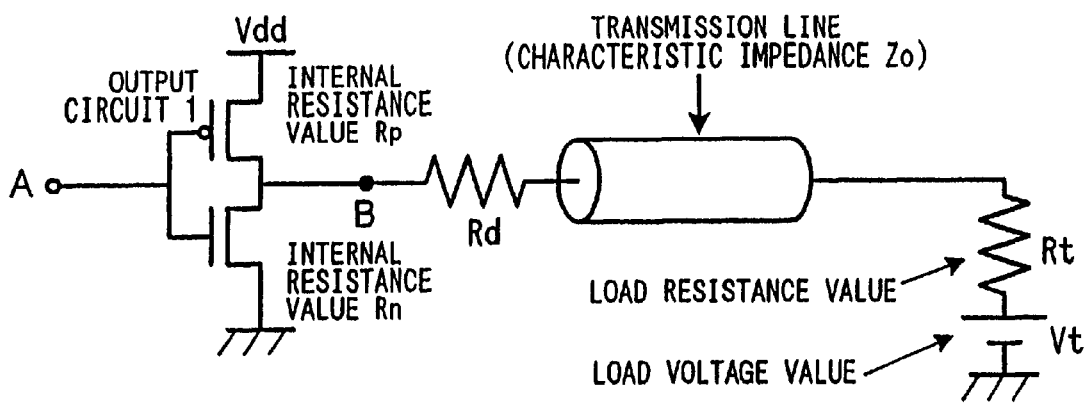
FIG. 1 is a circuit diagram showing a conventionally used MOS driver circuit connected to a transmission line.

Referring to figures, the following will discuss embodiments of the present invention. The same members are indicated by the same reference numerals in the figures and the description thereof is omitted.

Figure 4:
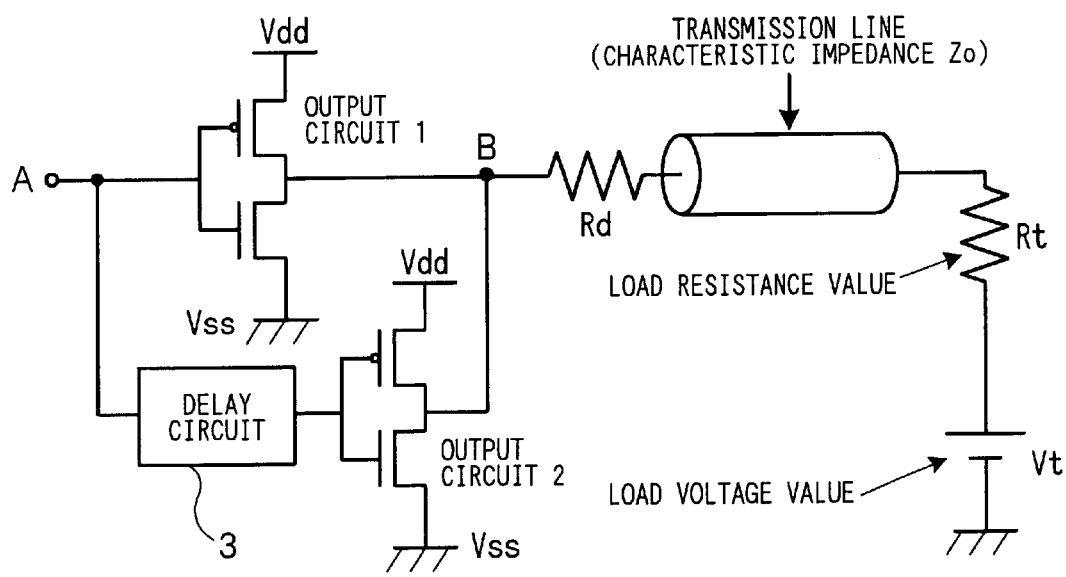
FIG. 4 is a circuit diagram showing a constant impedance driver circuit according to a first embodiment of the present invention.
Figure 5:
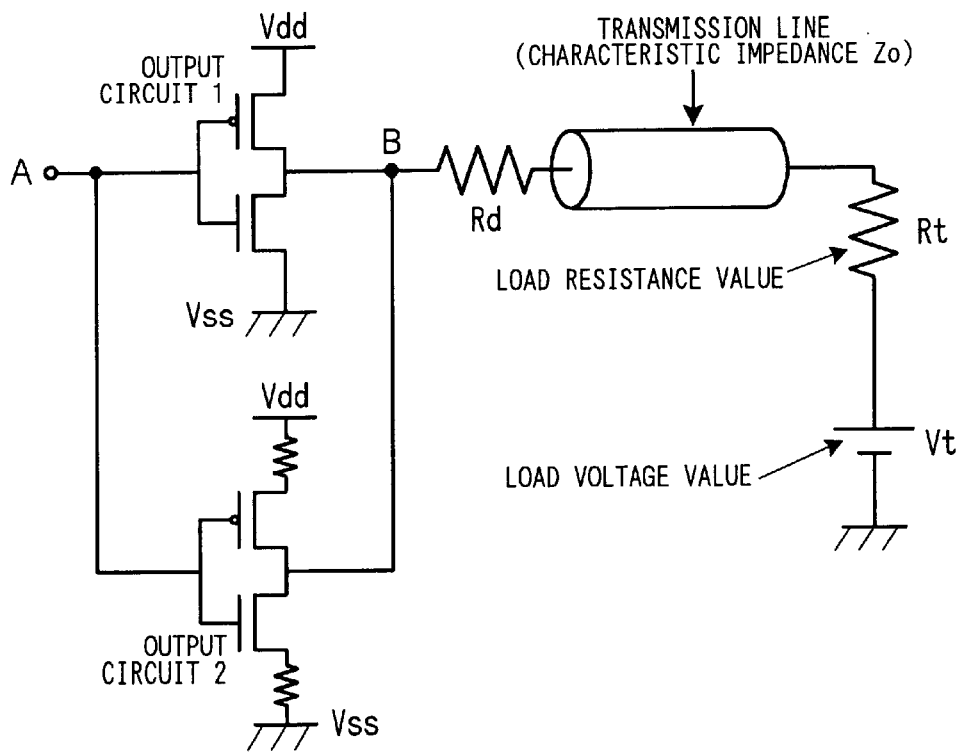
FIG. 5 is a circuit diagram showing a constant impedance driver circuit according to a second embodiment of the present invention.
Figure 6:
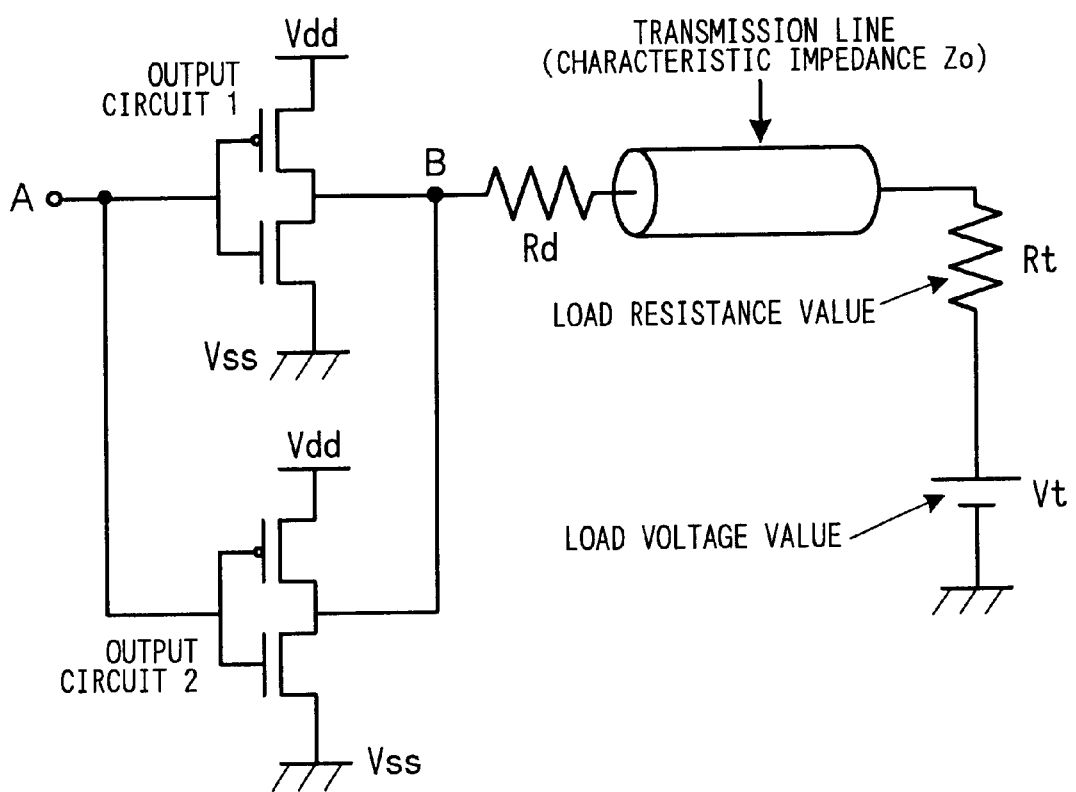
FIG. 6 is a circuit diagram showing a constant impedance driver circuit according to a third embodiment of the present invention.
Figure 7:
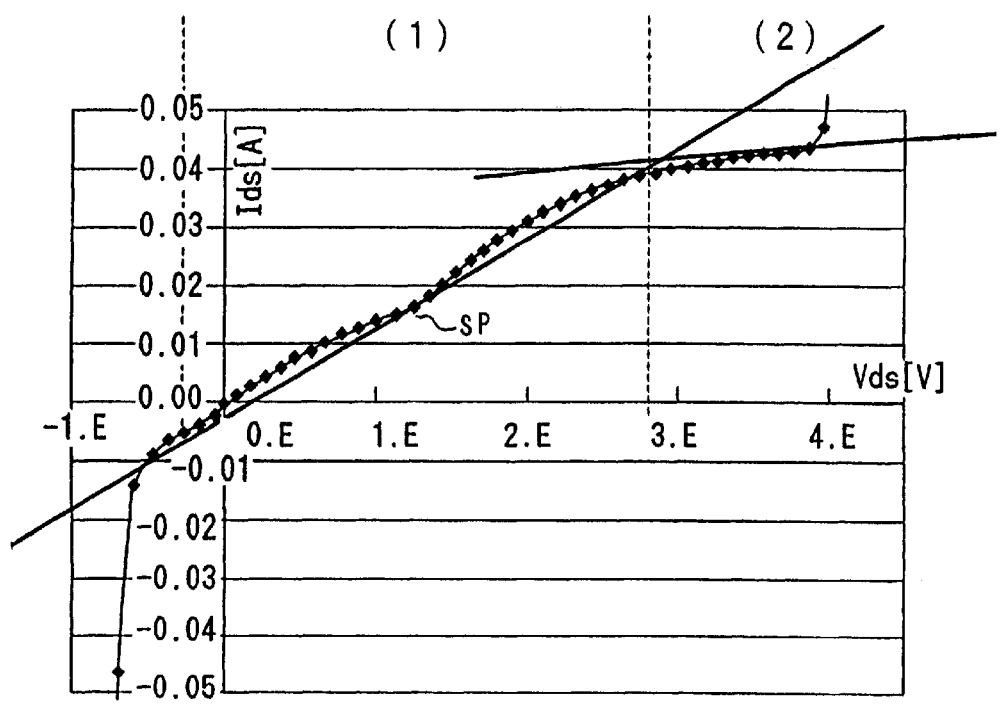
FIG. 7 is a diagram showing current-voltage characteristics at point B of an output terminal according to the first, second, and third embodiments of the present invention.
Figure 8:
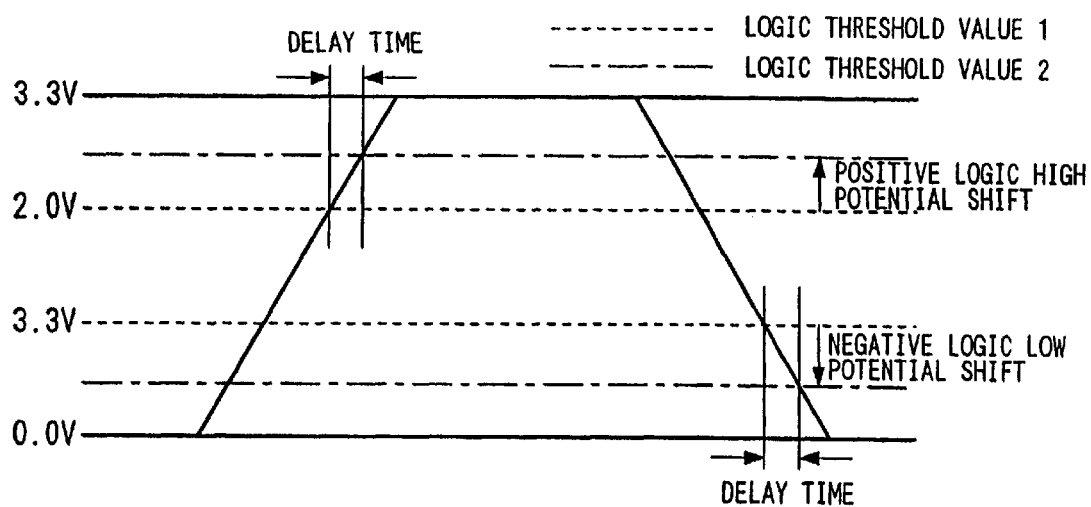
FIG. 8 is a conceptual rendering showing a shift in logical threshold value of the third embodiment.

FIG. 4 is a circuit diagram showing a constant impedance driver circuit according to a first embodiment of the present invention. FIG. 5 is a circuit diagram showing a constant impedance driver circuit according to a second embodiment of the present invention. FIG. 6 is a circuit diagram showing a constant impedance driver circuit according to a third embodiment of the present invention. FIG. 7 is a diagram showing current-voltage characteristics at point B of an output terminal according to the first, second, and third embodiments of the present invention. FIG. 8 is a conceptual rendering showing a shift in logical threshold value of the third embodiment.

(First Embodiment)

First, the first embodiment shown in FIG. 4 is different from the conventional art in that a single output circuit is constituted by a plurality of output circuits for multistage switching. In the first embodiment, an output circuit 1 connects a PMOS transistor and an NMOS transistor in series, and connects a terminal of the PMOS transistor to a power source Vdd, the other terminal of the NMOS transistor to GND, the gate to an input terminal A, and a connecting point to an output terminal B. The other output circuit 2 connects a PMOS transistor and an NMOS transistor in series, a terminal of the PMOS transistor to a power source Vdd, the other terminal of the NMOS transistor to GND, the gate to the input terminal A via a delay circuit 3, and a connecting point to the output terminal B.

In the first embodiment shown in FIG. 4, as described above, the delay circuit 3 is provided between the input terminal A and the common gate of the output circuit 2. The delay circuit is a circuit for delaying a signal of the input terminal A by using capacitance. With the switching timing delay mechanism, the constant impedance driver circuit can delay a switching timing between the output circuits 1 and 2. The switching timing of the output circuit 2, which includes the above switching timing delay mechanism, is the timing when current supplied to a point B of the output terminal reaches a saturation region, or before and after the timing. The current is supplied from the output circuit 1 not including the above switching timing delay mechanism. The switching of the output circuit 2 is delayed in this manner, so that the point B of the output terminal has current-voltage characteristics of shifting a saturation region (2) to a higher Vds (drain-source potential) as shown in FIG. 7. Assuming that this is constant impedance, constant output impedance characteristics are obtained. The following will further discuss this point.

Figure 2:
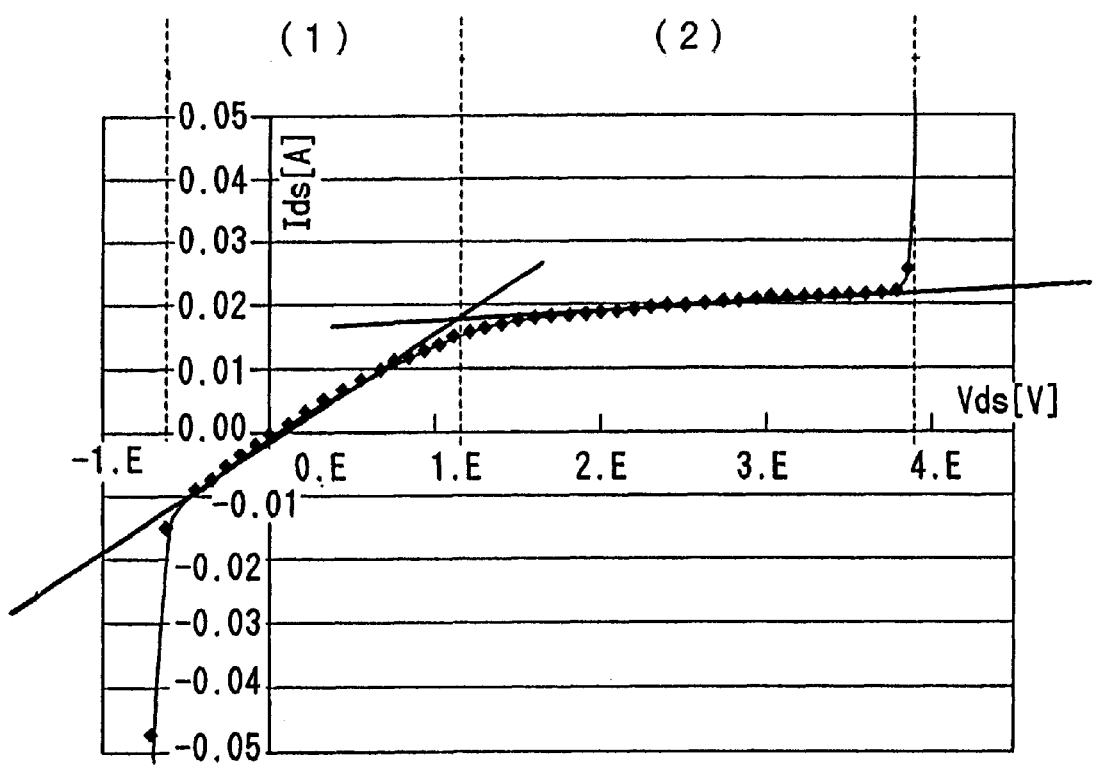
FIG. 2 is a diagram showing current-voltage characteristics of an output terminal at point B in FIG. 1.
Figure 3:
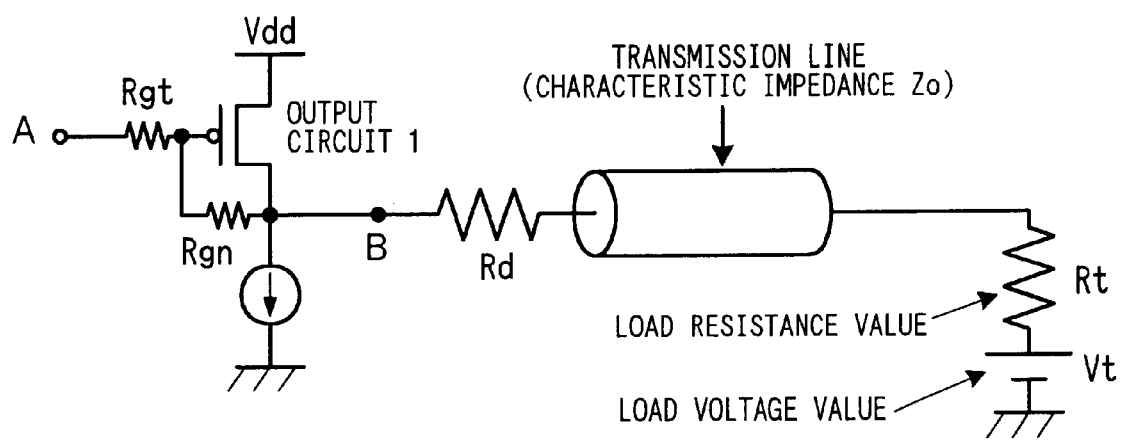
FIG. 3 is a diagram showing a conventional constant impedance output circuit.

Assuming that current is supplied from a pre-stage circuit (not shown) to the terminal A, at this moment, a potential of the output terminal B is determined by the state of load, a load impedance, load power supply and so on. As shown in FIG. 2, a potential of the output terminal B shows constant output impedance characteristics in a constant impedance region (1) but is shifted to the saturation region (2) as a potential Vds of the output terminal B increases. In view of the above constant impedance, dynamic change is found.

However, in the first embodiment, due to the function of the delay circuit 3, which is a switching timing delay mechanism connected to the output circuits 1 and 2 and the gate of the output circuit 2, it is possible to delay the switching timing between the output circuits 1 and 2. Hence, since the switching timing is delayed, when current supplied from the output circuit 1 reaches the saturation region (2) in FIG. 2, current is supplied from the output circuit 2. Thus, as shown in FIG. 7, it looks as if the saturation region (2) shifted to a higher Vds. Therefore, a region having constant output impedance characteristics increases in size, and it is possible to readily perform impedance matching with load.

Next, the following will discuss a method for designing a constant impedance driver circuit of the first embodiment.

First, a piecewise-linear of an output terminal current-voltage curve of the output circuit is obtained and a straight line approximate to the piecewise-linear is found. A segment point SP of the output terminal current-voltage curve is found based on the straight line approximate to the piecewise-linear, and the delay time is obtained based on the found segment point.

The obtained delay time is made equal to a difference between the delayed switching time of the output circuit 2 and the switching time of the output circuit 1. The output circuit 2 includes the above switching timing delay mechanism (delay circuit 3) and the output circuit 1 does not include the above switching timing delay mechanism.

(Second Embodiment)

The second embodiment shown in FIG. 5 is a constant impedance driver circuit, which is composed of output circuits 1 and 2 and is provided with a reference potential shift mechanism being capable of setting a high source potential of the output circuit 2. In the second embodiment, the output circuit 2 does not include a delay circuit 3. Instead, a terminal of a PMOS transistor is connected to a power source Vdd via a resistance, and the other terminal of an NMOS transistor is connected to GND via a resistance.

The second embodiment is different from the first embodiment in the following point.

In the case where current is supplied to a terminal A, when the output circuit 2 and the output circuit 1 are equal in logic threshold value potential level, the output circuit 2 including the reference potential shift mechanism (resistance on a terminal of the PMOS transistor and resistance on the other terminal of the NMOS transistor), the output circuit 1 not including the reference potential shift mechanism, the switching timings of the output circuit 1 and the output circuit 2 are shifted, and the current of the output circuit 2 is delayed behind the current of the output circuit 1 and is supplied to an output terminal B. The above difference is made because a MOS transistor is switched according to a gate-source potential Vgs and an actual current has limited rise time and fall time. Thus, as in the first embodiment, output impedance characteristics can be made constant in the end.

Next, the following will discuss a method for designing a constant impedance driver circuit of the second embodiment.

First, delay time is found as in the first embodiment. And then, the found delay time is made equal to a difference between the delayed switching time of the output circuit, which includes the reference potential shift mechanism, and the switching time of the output circuit not including the reference potential shift mechanism.

(Third Embodiment)

In the third embodiment shown in FIG. 6, output circuits 1 and 2 each connect a PMOS transistor and an NMOS transistor in series, connect a terminal of the PMOS transistor to a power source Vdd, the other terminal of the NMOS transistor to GND, a common gate to an input terminal A, and a connecting point to an output terminal B.

However, a constant impedance driver circuit is provided with a threshold value potential shift mechanism, which shifts a positive logic threshold value of the output circuit 2 to a higher potential than a positive logic threshold value of the output circuit 1, and shifts a negative logic threshold value of the output circuit 2 to a lower potential than a negative logic threshold value of the output circuit 1. The output circuit 1 has a logic threshold value 1 indicated by a broken line in FIG. 8. The output circuit 2 has a logic threshold value 2, which shifts its positive logic to a potential higher than the logic threshold value 1 and shifts its negative logic to a potential lower than the logic threshold value 1. The logic threshold value 2 is indicated by alternate long and short dashed lines. Regarding these output circuits, the switching timing of the output circuit 2 is delayed behind that of the output circuit 1. Therefore, as in the first and second embodiments, the constant impedance driver circuit has constant output impedance characteristics.

Next, the following will discuss a method for designing a constant impedance driver circuit of the third embodiment.

First, as in the first embodiment, delay time is found. And then, the found delay time is made equal to a difference between the delayed switching time of the output circuit, which includes the threshold value potential shift mechanism, and the switching time of the output circuit not including the threshold value potential shift mechanism.

In any one of the above first, second, and third embodiments, by using transistors having equal capabilities of supplying current as current sources, an output impedance does not exceed the output impedance obtained by a single transistor, and only the saturation region shifts to a high Vds. Hence, as compared with the conventional art (JP A5-267952), the current supply capability can be determined only by the capability of the transistor, and a low-current constant impedance driver circuit can be formed with ease.

Further, as compared with the conventional art (JP A5-267952), it is not necessary to supply current from the pre-stage circuit to the output terminal B, resulting in small load applied to the output circuit of the pre-stage circuit inside the LSI. For this reason, it is possible to complement necessary current by using the switching timing delay mechanism, the reference potential shift mechanism, and the threshold value potential shift mechanism that are constituted by the plurality of output circuits and the delay circuit of the present embodiments, and it is possible to achieve constant output impedance characteristics.

Additionally, the present invention is not limited to the above embodiments and modifications are allowed within the abstract of the invention. The above embodiments provide the delay circuit by using capacitance. A latch circuit, a flip-flop, a buffer, and a resistance are also applicable.

Moreover, the reference potential shift mechanism can be formed using a constant voltage source as well as a resistance partial pressure. Although a single constant impedance driver circuit has two output circuits in FIGS. 4, 5, and 6, a plurality of circuits may be included. The switching timing delay mechanism, the reference potential shift mechanism, and the threshold value potential shift mechanism may be provided for a plurality of output circuits. Furthermore, irregularity is allowed in current supply capabilities and in other characteristics among a plurality of transistors.

What is claimed is:

1. A constant impedance driver circuit, comprising a plurality of output circuits for supplying current from an output terminal of a pre-stage circuit, output terminals of the output circuits being connected to each other; and a switching timing delay mechanism provided for at least one of said plurality of output circuits, the switching timing delay mechanism including a delay circuit for delaying an output of current behind the other output circuits, said output circuit including said switching timing delay mechanism performing switching by using said switching timing delay mechanism at a timing when current supplied from the other output circuits not including said switching timing delay mechanism reaches a saturation region to keep output impedance characteristics constant.

2. A constant impedance driver circuit, comprising a plurality of output circuits for supplying current from an output terminal of a pre-stage circuit, output terminals of the output circuits being connected to each other; and a reference potential shift mechanism provided for at least one of said plurality of output circuits, the reference potential shift mechanism making a shift to a higher potential in order to delay on output of current behind the other output circuits, said output circuit including said reference potential shift mechanism performing switching by using said reference potential shift mechanism at a timing when current supplied from the other output circuits not including said reference potential shift mechanism reaches a saturation region to keep output impedance characteristics constant.

3. A constant impedance driver circuit, comprising a plurality of output circuits for supplying current from an output terminal of a pre-stage circuit, output terminals of the output circuits being connected to each other; and a threshold value potential shift mechanism provided for at least one of said plurality of output circuits, the threshold value potential shift mechanism shifting a negative logic threshold value to a lower potential and shifting a positive logic threshold value potential to a higher potential than the other output circuits in order to delay an output of current behind the other output circuits, and said output circuit including said threshold value potential shift mechanism performing switching by using said threshold value potential shift mechanism at a timing when current supplied from the other output circuits not including said threshold value potential shift mechanism reaches a saturation region to keep output impedance characteristics constant.

4. A designing method of a constant impedance driver circuit comprising a plurality of output circuits for supplying current from an output terminal of a pre-stage circuit, output terminals of the output circuits being connected to each other, comprising:

a step of obtaining a piecewise-linear of an output terminal current-voltage curve of said output circuit and obtaining a straight line approximate to the piecewise-linear;

a segment point analyzing step of finding a segment point of said output terminal current-voltage curve based on the straight line approximate to the piecewise-linear obtained in said step;

a delay time analyzing step of finding a delay time up to the segment point obtained in said segment point analyzing step; and a step of making the delay time equal to a difference between a delayed current output time of at least one of said output circuits and a current output time of the other output circuits, said delay time being obtained in said delay time analyzing step.

5. The method for designing a constant impedance driver circuit according to claim 4, wherein the delay time obtained in said delay time analyzing step is equal to a difference between the delayed switching time of said output circuit including said reference potential shift mechanism and the switching time of said output circuit not including said reference potential shift mechanism.

6. The method for designing a constant impedance driver circuit according to claim 4, wherein the delay time obtained in said delay time analyzing step is equal to a difference between the delayed switching time of said output circuit including said threshold value potential shift mechanism and the switching time of said output circuit not including said threshold value potential shift mechanism.

* * * * *